(12) United States Patent
Wyrzykowska et al.

(10) Patent No.: US 7,515,434 B2
(45) Date of Patent: Apr. 7, 2009

(54) TECHNIQUE FOR ENHANCING CIRCUIT DENSITY AND PERFORMANCE

(75) Inventors: Aneta Wyrzykowska, Dunrobin (CA); Herman Kwong, Kanata (CA); Kah Ming Soh, Kanata (CA)

(73) Assignee: Nortel Networks Limited, St. Laurent, Ontario (CA)

( * ) Notice: Subject to any disclaimer, the term of this patent is extended or adjusted under 35 U.S.C. 154(b) by 346 days.

(21) Appl. No.: 11/014,962

(22) Filed: Dec. 20, 2004

(65) Prior Publication Data

US 2006/0133056 A1    Jun. 22, 2006

(51) Int. Cl.
    *H05K 1/18* (2006.01)
(52) U.S. Cl. .............. 361/763; 361/761; 361/306.3; 361/302; 174/256; 174/260
(58) Field of Classification Search ......... 361/763–766, 361/782, 792, 793, 795, 761, 306.3, 302; 174/260–266, 256; 257/678, 687, 690, 700, 257/788, 795; 438/50, 106, 107, 109, 121, 438/124
See application file for complete search history.

(56) References Cited

U.S. PATENT DOCUMENTS

| | | | | |
|---|---|---|---|---|
| 5,998,275 | A * | 12/1999 | Richiuso | 438/381 |
| 6,291,272 | B1 * | 9/2001 | Giri et al. | 438/121 |
| 6,459,561 | B1 * | 10/2002 | Galvagni et al. | 361/306.3 |
| 6,495,912 | B1 * | 12/2002 | Huang et al. | 257/700 |
| 6,607,934 | B2 * | 8/2003 | Chang et al. | 438/50 |
| 6,653,574 | B2 * | 11/2003 | Tsai et al. | 174/260 |
| 6,734,542 | B2 * | 5/2004 | Nakatani et al. | 257/687 |
| 6,939,738 | B2 * | 9/2005 | Nakatani et al. | 438/108 |
| 6,987,661 | B1 * | 1/2006 | Huemoeller et al. | 361/312 |
| 7,102,085 | B2 * | 9/2006 | Ohta et al. | 174/260 |
| 2002/0117743 | A1 * | 8/2002 | Nakatani et al. | 257/687 |
| 2002/0185303 | A1 * | 12/2002 | Takeuchi et al. | 174/256 |
| 2003/0090883 | A1 * | 5/2003 | Asahi et al. | 361/761 |
| 2003/0178726 | A1 * | 9/2003 | Ogawa et al. | 257/758 |
| 2004/0113752 | A1 * | 6/2004 | Schuster | 338/310 |
| 2005/0253247 | A1 * | 11/2005 | Imoto et al. | 257/700 |
| 2006/0007662 | A1 * | 1/2006 | Vasudivan et al. | 361/763 |

* cited by examiner

*Primary Examiner*—Tuan T Dinh
*Assistant Examiner*—Xiaoliang Chen
(74) *Attorney, Agent, or Firm*—Hunton & Williams LLP

(57) ABSTRACT

A technique for enhancing circuit density and performance is disclosed. In one particular exemplary embodiment, the technique may be realized as a method for enhancing circuit density and performance of a microelectronic module. The method may comprise forming a discrete package, wherein the discrete package comprises one or more passive devices that are desirable for the performance of the microelectronic module. The method may also comprise coupling the discrete package to the microelectronic module.

15 Claims, 9 Drawing Sheets

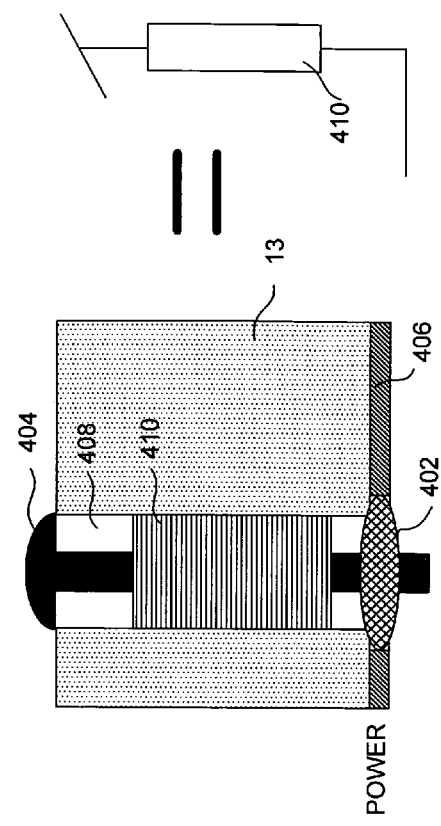
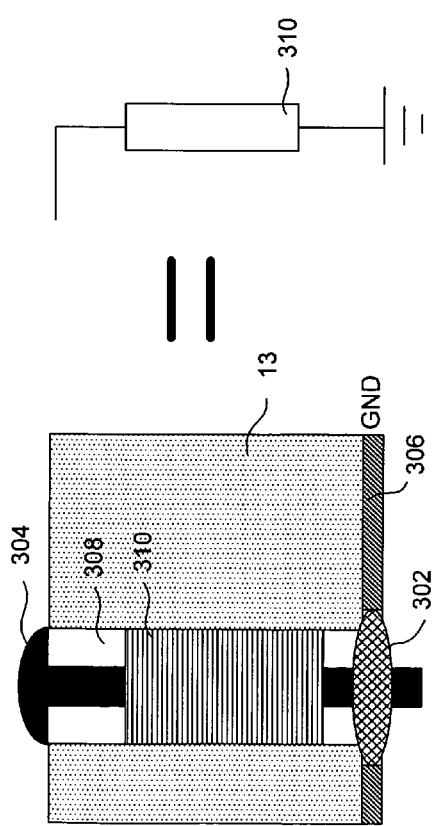

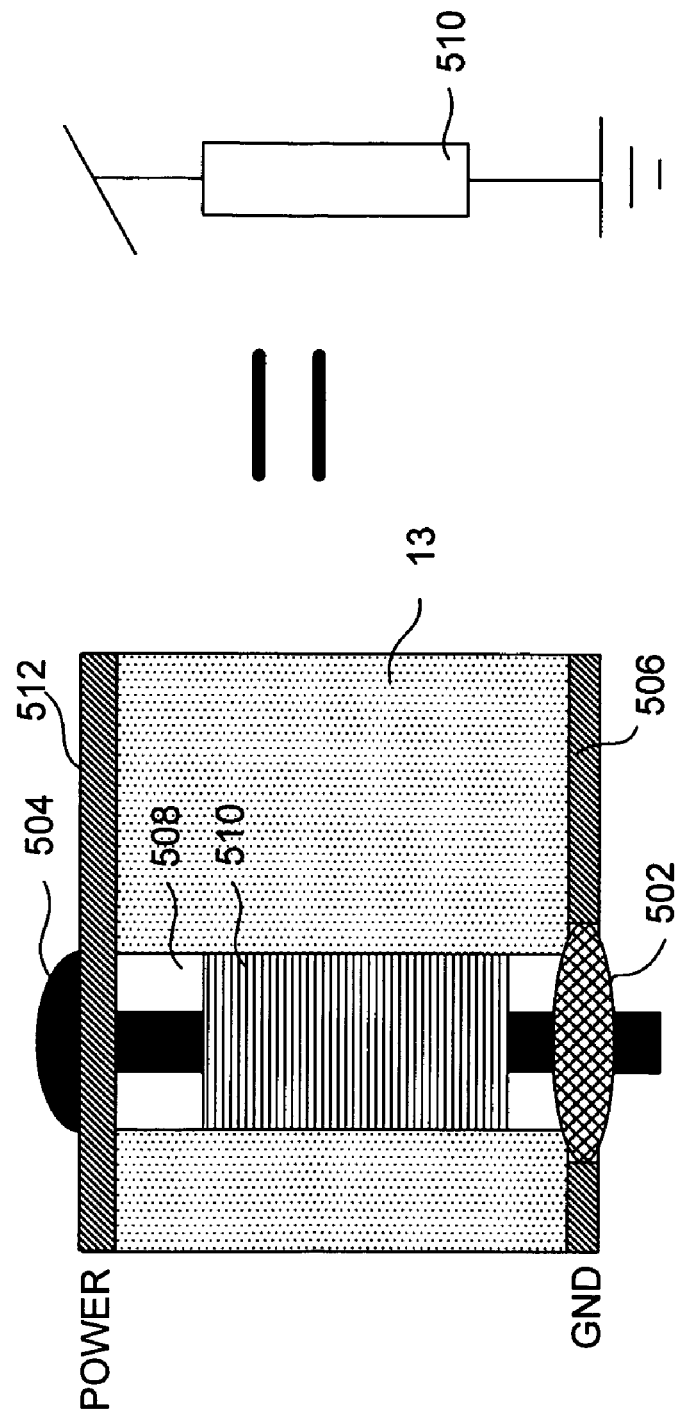

TECHNIQUE FOR ENHANCING CIRCUIT DENSITY AND PERFORMANCE

FIELD OF THE DISCLOSURE

The present disclosure relates generally to microelectronics and packaging and, more particularly, to a technique for enhancing circuit density and performance.

BACKGROUND OF THE DISCLOSURE

Recent developments in design and fabrication technologies have made it possible to build a large number of micro devices (e.g., electronic devices, mechanical devices, and optical devices) on a single substrate to form a highly integrated micro-system. One or more micro-systems may be further packaged to form a microelectronic module.

While many devices can be successfully miniaturized and integrated, such is not the case with some devices. For example, it is usually difficult to fabricate passive devices (e.g., capacitors and inductors) together with active devices (e.g., transistors). It is even more difficult to scale down passive devices and active devices simultaneously. On the other hand, as modern IC's are operating at faster speeds and lower power levels, it is often necessary to use passive devices, such as decoupling capacitors, to mitigate electromagnetic interference (EMI) (e.g., cross-talk and power distribution noises) among densely packed circuit elements. However, integrated capacitors and inductors usually take up a substantial amount of chip area and cost extra effort to design or fabricate.

Various approaches have been proposed to implement off-chip passive devices for a microelectronic module. In one approach, passive devices desirable for a microelectronic module are surface-mounted on a circuit board that hosts the microelectronic module. The passive devices are individually packaged elements and are electrically coupled with the microelectronic module via a number of traces. If the microelectronic module has a large number of input/output (I/O) pins or if the I/O pins have small pitches, the passive devices may have to be placed inches away from where they are needed and the traces may run even longer distances. Such remotely placed passive devices can introduce further interferences or other complications to the performance of the microelectronic module. Although passive devices of smaller-than-usual sizes have been tried, they often pose reliability problems and have not been widely adopted.

According to another approach, passive devices desirable for a microelectronic module may be embedded in a circuit board that hosts the microelectronic module. However, circuit boards with embedded passive devices are usually expensive to manufacture. Since the passive devices, once embedded, cannot be altered or replaced, there is no room for error in the design and fabrication of the circuit board. That is, if a finished circuit board with embedded passive devices is found unsatisfactory, the whole circuit board is wasted.

In view of the foregoing, it would be desirable to provide a technique for enhancing circuit density and performance which overcomes the above-described inadequacies and shortcomings.

SUMMARY OF THE DISCLOSURE

A technique for enhancing circuit density and performance is disclosed. In one particular exemplary embodiment, the technique may be realized as a method for enhancing circuit density and performance of a microelectronic module. The method may comprise forming a discrete package, wherein the discrete package comprises one or more passive devices that are desirable for the performance of the microelectronic module. The method may also comprise coupling the discrete package to the microelectronic module.

In accordance with other aspects of this particular exemplary embodiment, the one or more passive devices may be selected from a group consisting of resistors, capacitors, and inductors.

In accordance with further aspects of this particular exemplary embodiment, the method may further comprise forming a via hole in the discrete package and placing at least one of the one or more passive devices in the via hole.

In accordance with additional aspects of this particular exemplary embodiment, the method may further comprise forming a via hole in the discrete package and filling the via hole with one or more materials to form at least one of the one or more passive devices.

In accordance with another aspect of this particular exemplary embodiment, the method may further comprise mounting at least one of the one or more passive devices on a surface of the discrete package. Alternatively, the method may further comprise embedding at least one of the one or more passive devices inside the discrete package.

In accordance with yet another aspect of this particular exemplary embodiment, the method may further comprise forming an array of passive devices in the discrete package and configuring the array to provide the one or more passive devices that are desirable for the performance of the microelectronic module.

In accordance with still another aspect of this particular exemplary embodiment, the method may further comprise mounting the microelectronic module on a first side of a circuit board and mounting the discrete package on a second side of the circuit board.

In accordance with a further aspect of this particular exemplary embodiment, the method may further comprise mounting the discrete package directly on the microelectronic module.

In accordance with a still further aspect of this particular exemplary embodiment, the one or more passive devices may provide a decoupling function for the microelectronic module.

In one particular exemplary embodiment, the technique may be realized by a discrete package for enhancing circuit density and performance of a microelectronic module. The discrete package may comprise one or more passive devices, wherein the one or more passive devices are desirable for the performance of the microelectronic module, and the discrete package is configured to be coupled to the microelectronic module.

In accordance with other aspects of this particular exemplary embodiment, the one or more passive devices may be selected from a group consisting of resistors, capacitors, and inductors.

In accordance with further aspects of this particular exemplary embodiment, at least one of the one or more passive devices may be placed in a via hole in the discrete package.

In accordance with additional aspects of this particular exemplary embodiment, at least one of the one or more passive devices may be formed by filling a via hole in the discrete package with one or more materials.

In accordance with another aspect of this particular exemplary embodiment, at least one of the one or more passive devices may be mounted on a surface of the discrete package.

In accordance with yet another aspect of this particular exemplary embodiment, at least one of the one or more passive devices may be embedded inside the discrete package.

In accordance with still another aspect of this particular exemplary embodiment, the discrete package may further comprise an array of passive devices that is configured to provide the one or more passive devices that are desirable for the performance of the microelectronic module.

In accordance with a further aspect of this particular exemplary embodiment, the microelectronic module may be mounted on a first side of a circuit board, and the discrete package may be mounted on a second side of the circuit board.

In accordance with a yet further aspect of this particular exemplary embodiment, the discrete package may be mounted directly on the microelectronic module.

In accordance with a still further aspect of this particular exemplary embodiment, the one or more passive devices may provide a decoupling function for the microelectronic module.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 3 illustrates an exemplary passive device unit configured as a pull-down element in a discrete package in accordance with an embodiment of the present disclosure.

FIG. 4 illustrates an exemplary passive device unit configured as a pull-up element in a discrete package in accordance with an embodiment of the present disclosure.

FIG. 5 illustrates an exemplary passive device unit configured as a pass-through element in a discrete package in accordance with an embodiment of the present disclosure.

DETAILED DESCRIPTION OF EXEMPLARY EMBODIMENT(S)

Figure 1:
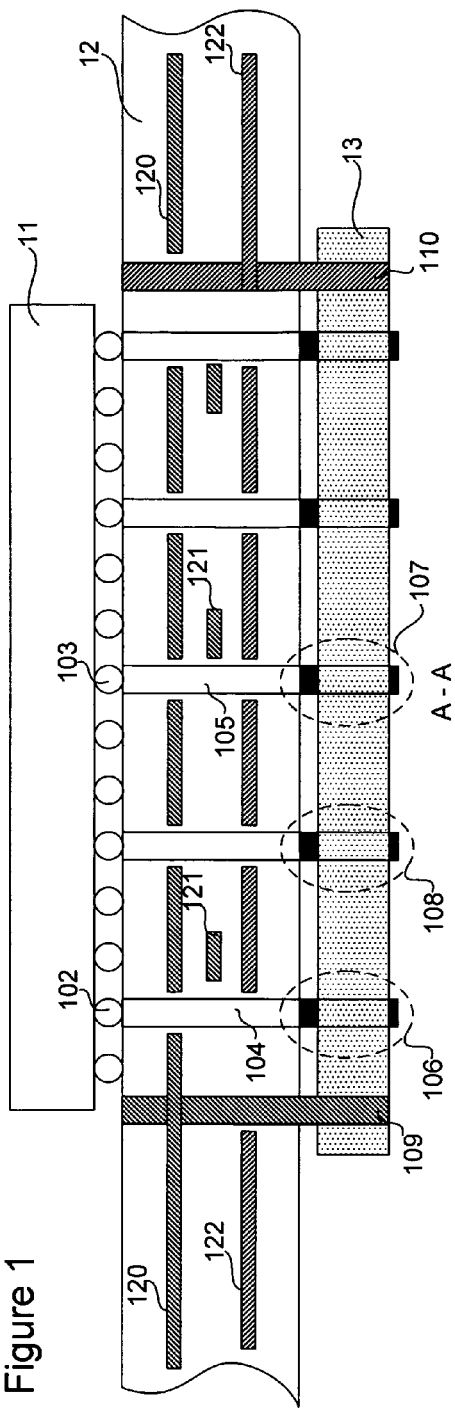
FIG. 1 shows an exemplary assembly of a microelectronic module, a circuit board, and a discrete package in accordance with an embodiment of the present disclosure.

Referring to FIG. 1, there is shown an exemplary assembly of a microelectronic module 11, a circuit board 12, and a discrete package 13 in accordance with an embodiment of the present disclosure.

In this disclosure, a "microelectronic module" may be a physical assembly that comprises any type of devices, circuits, structures, or combination thereof. Typical microelectronic modules include, for example, microprocessors, microcontrollers, packaged operational amplifiers, radio-frequency (RF) IC's, and micro-electro-mechanical system (MEMS) sensors.

The microelectronic module 11 may comprise one or more integrated circuits in a package with I/O pins (e.g., I/O pins 102 and 103, and power/ground pins). The circuit board 12 may be a multi-layered printed circuit board (PCB) having, for example, one or more signal layers 121, GROUND planes 120, and POWER planes 122. The discrete package 13 may comprise a number of passive devices that are desirable for the microelectronic module 11. For example, in order to reduce power or ground noise, it may be desirable to connect one or more decoupling capacitors to some I/O pins of the microelectronic module 11. In order to increase noise margins, it may be desirable to pull some I/O pins up to POWER and/or to pull some I/O pins down to GROUND. The passive devices needed for these and other purposes may be provided collectively in the discrete package 13. The passive device units (e.g., 106, 107, and 108) that contain the passive devices will be describe in detail below. The discrete package 13 may be either single-layered or multi-layered, and it may be either rigid or flexible. The passive devices may be either surface-mounted or embedded, as will be described in detail below.

The microelectronic module 11 may be mounted on a first side of the circuit board 12, and the discrete package may be mounted on a second side of the circuit board 12. The circuit board 12 may have a number of vias (e.g., 104 and 105) to accommodate the I/O pins of the microelectronic module 11 and to facilitate interconnects between the I/O pins and the passive devices in the discrete package 13. Further, a GROUND via 109 may couple a first portion of the discrete package 13 to the GROUND plane 120 in the circuit board 12. A POWER via 110 may couple a second portion of the discrete package 13 to the POWER plane 122 in the circuit board 12.

Figure 2:
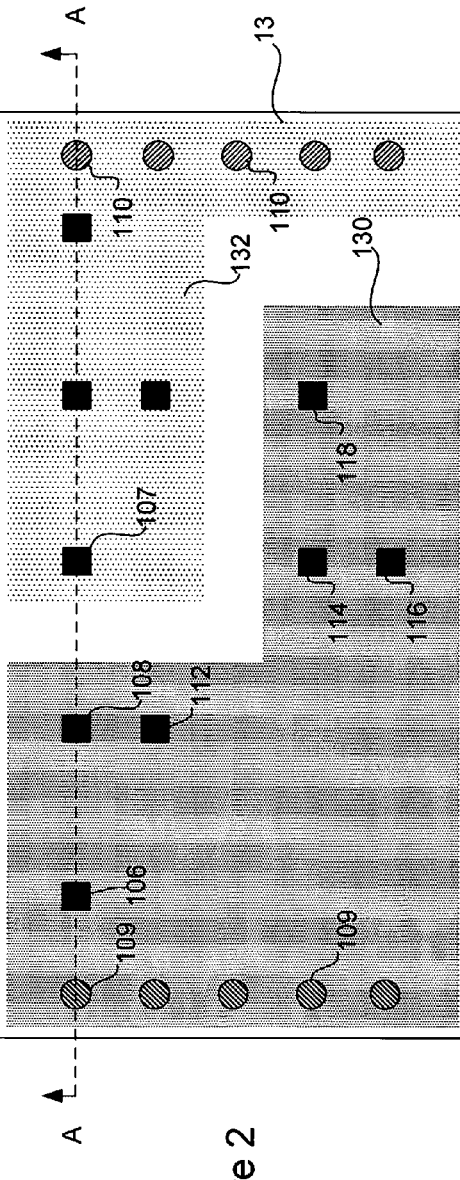
FIG. 2 is a bottom view of the exemplary discrete package shown in FIG. 1.

FIG. 2 is a bottom view of the exemplary assembly shown in FIG. 1. FIG. 1 may show a cross-section of the exemplary assembly along a line A-A of FIG. 2. There may be an array of GROUND vias 109, POWER vias 110, and passive device units (e.g., 106, 107, 108, 112, 114, 116, and 118) in the discrete package 13. POWER and GROUND may be further distributed in the discrete package 13, for example, via a POWER plane 132 and a GROUND plane 130 respectively.

FIG. 3 illustrates an exemplary passive device unit configured as a pull-down element in a discrete package in accordance with an embodiment of the present disclosure. This exemplary passive device unit may be the passive device unit 106 shown in FIGS. 1 and 2. A via 308 may be formed in the discrete package 13. A passive device 310 (e.g., a resistor, a capacitor, or an inductor) may be formed in the via 308. To form the passive device 310, a pre-packaged device may be placed in the via 308. Alternatively, the via 308 may be filled with a combination of materials, such as resistive materials, dielectric materials, and/or conductive materials, to form a structure that functions as the desired passive device 310. A first terminal of the passive device 310 may be coupled to an interconnect 304 that is further coupled to the I/O pin 102 through the via 104 shown in FIG. 1. A second terminal of the passive device 310 may be coupled to a solder point 302 that is further coupled to a GROUND plane 306 which may be a portion of the GROUND plane 130 shown in FIG. 2. As a result, the passive device 310 may function as a pull-down element that pulls the I/O pin 102 of the microelectronic module 11 down to GROUND.

FIG. 4 illustrates an exemplary passive device unit configured as a pull-up element in a discrete package in accordance with an embodiment of the present disclosure. This exemplary passive device unit may be the passive device unit 107 shown in FIGS. 1 and 2. A via 408 may be formed in the discrete package 13. A passive device 410 (e.g., a resistor, a capacitor, or an inductor) may be formed in the via 408. To form the passive device 410, a pre-packaged device may be placed in the via 408. Alternatively, the via 408 may be filled with a combination of materials, such as resistive materials, dielectric materials, and/or conductive materials, to form a structure that functions as the desired passive device 410. A first terminal of the passive device 410 may be coupled to an interconnect 404 that is further coupled to the I/O pin 103 through the via 105 shown in FIG. 1. A second terminal of the passive device 410 may be coupled to a solder point 402 that is further coupled to a POWER plane 406 which may be a portion of the POWER plane 132 shown in FIG. 2. As a result, the passive device 410 may function as a pull-up element that pulls the I/O pin 103 of the microelectronic module 11 up to POWER.

FIG. 5 illustrates an exemplary passive device unit configured as a pass-through element (e.g., a decoupling capacitor) in a discrete package in accordance with an embodiment of the present disclosure. This exemplary passive device unit may be the passive device unit 108 shown in FIGS. 1 and 2. A via 508 may be formed in the discrete package 13. A passive device 510 (e.g., a resistor, a capacitor, or an inductor) may be formed in the via 508. To form the passive device 510, a pre-packaged device may be placed in the via 508. Alternatively, the via 508 may be filled with a combination of materials, such as resistive materials, dielectric materials, and/or conductive materials, to form a structure that functions as the desired passive device 510. A first terminal of the passive device 510 may be coupled to an interconnect 504 that is further coupled to a POWER plane 512 on a top side of the discrete package 13. The POWER plane 512 may be coupled to one or more POWER pins of the microelectronic module 11, or to a circuit board. A second terminal of the passive device 510 may be coupled to a solder point 502 that is further coupled to a GROUND plane 506 which may be a portion of the GROUND plane 130 shown in FIG. 2. As a result, the passive device 510 may function as a pass-through element between the POWER pins of the microelectronic module 11 and GROUND.

Figure 6:
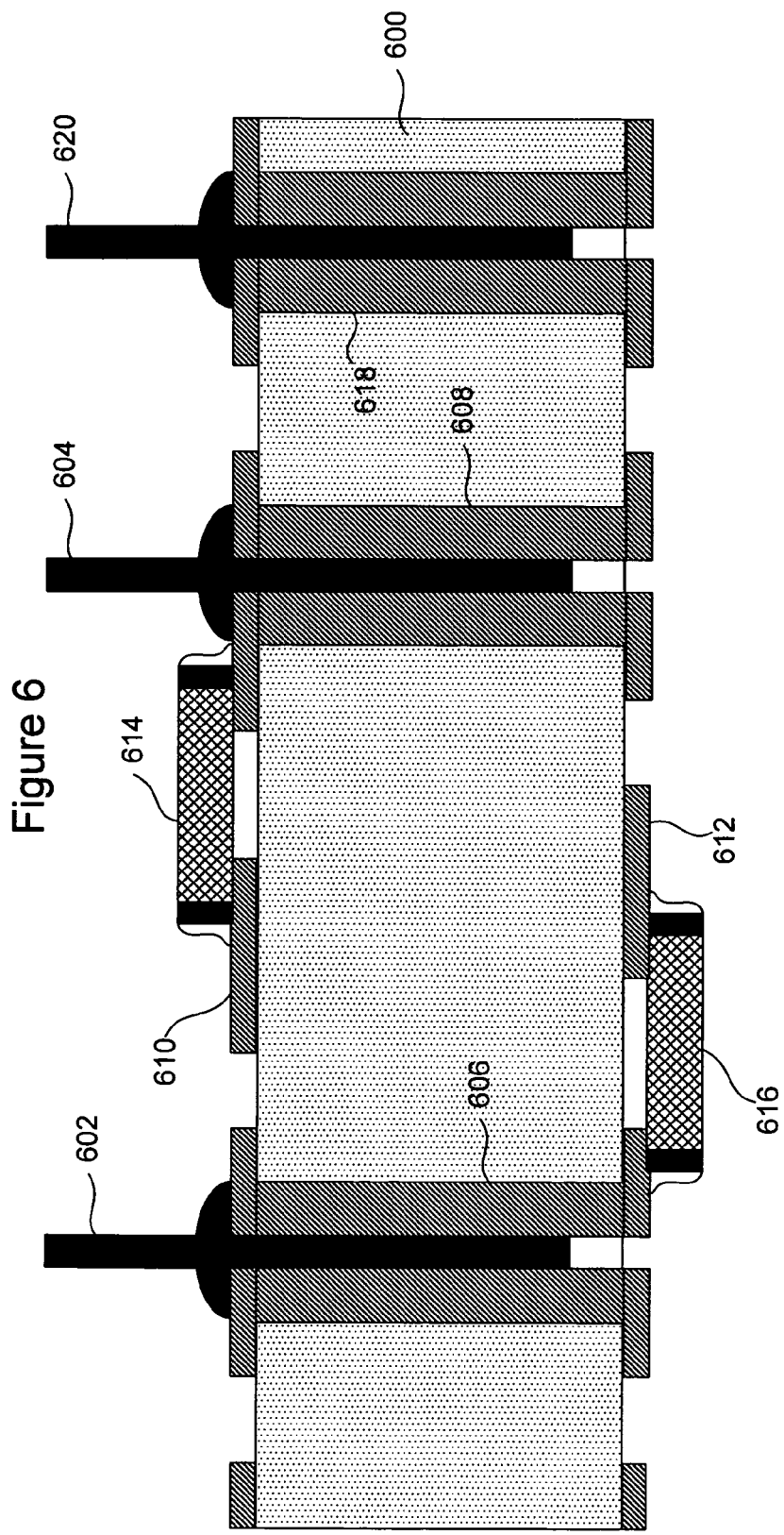
FIG. 6 is a cross-sectional view of a portion of an exemplary discrete package configured for signal termination in accordance with an embodiment of the present disclosure.

FIG. 6 is a cross-sectional view of a portion of an exemplary discrete package 600 configured for signal termination in accordance with an embodiment of the present disclosure. The exemplary discrete package 600 may have a structure similar to a circuit board. Via interconnects (e.g., 606, 608, and 618) may be formed in the discrete package 600 to accommodate I/O pins (e.g., 602, 604, and 620) of a microelectronic module and to route signals from a first side to a second side of the discrete package 600. Passive devices (e.g., 614 and 616) may be mounted on either side of the discrete package 600 to terminate signals to GROUND. For example, the passive device 614 may be mounted with a first terminal coupled to the via interconnect 608 and a second terminal coupled to a GROUND plane 610. The passive device 616 may be mounted with a first terminal coupled to the via interconnect 606 and a second terminal coupled to a GROUND plane 612.

Figure 7:
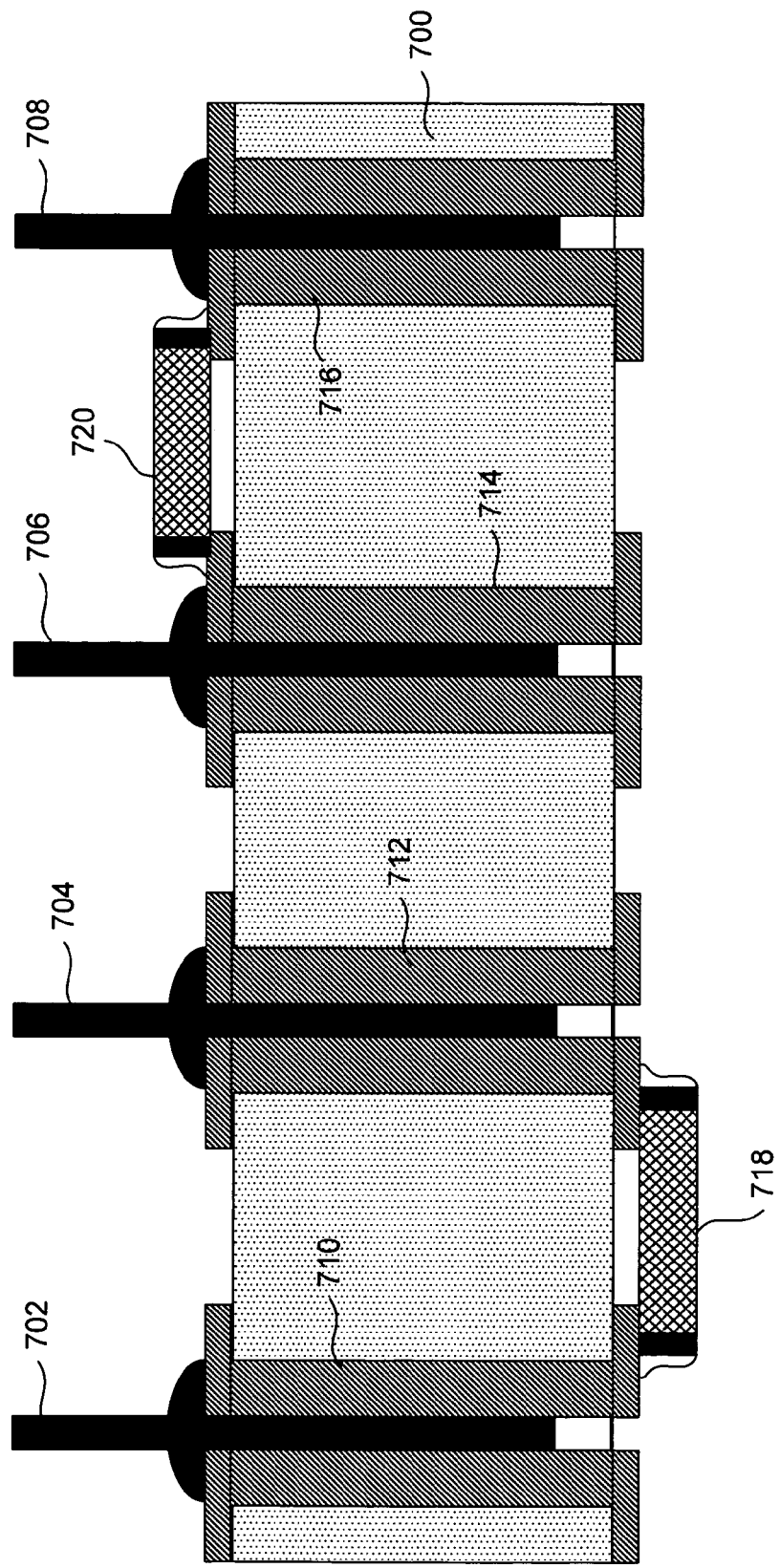
FIG. 7 is a cross-sectional view of a portion of an exemplary discrete package configured for signal pass-through in accordance with an embodiment of the present disclosure.

FIG. 7 is a cross-sectional view of a portion of an exemplary discrete package 700 configured for signal pass-through in accordance with an embodiment of the present disclosure. The exemplary discrete package 700 may have a structure similar to a circuit board. Via interconnects (e.g., 710, 712, 714, and 716) may be formed in the discrete package 700 to accommodate I/O pins (e.g., 702, 704, 706, and 708) of a microelectronic module and to route signals from a first side to a second side of the discrete package 700. Passive devices (e.g., 718 and 720) may be mounted on either side of the discrete package 700. For example, the passive device 718 may be mounted with a first terminal coupled to the via interconnect 710 and a second terminal coupled to the via interconnect 712, thereby allowing signals from the I/O pin 702 to pass through the passive device 718 to the I/O pin 704 or vice versa. The passive device 720 may be mounted with a first terminal coupled to the via interconnect 714 and a second terminal coupled to the via interconnect 716, thereby allowing signals from the I/O pin 706 to pass through the passive device 720 to the I/O pin 708 or vice versa.

Figure 8:
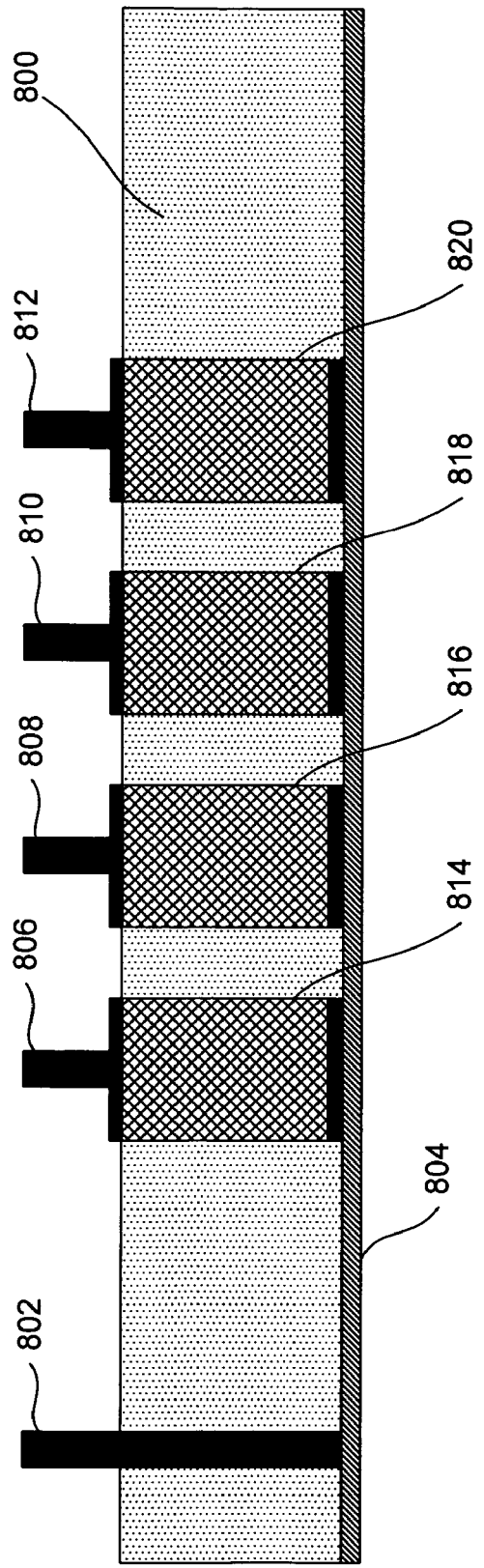
FIG. 8 is a cross-sectional view of a portion of an exemplary discrete package configured for signal termination in accordance with an embodiment of the present disclosure.

FIG. 8 is a cross-sectional view of a portion of an exemplary discrete package 800 configured for signal termination in accordance with an embodiment of the present disclosure. The exemplary discrete package 800 may have a base made of potted epoxy, for example. A GROUND pin 802 may couple a GROUND plane 804 to a signal ground. An array or matrix of passive devices (e.g., 814, 816, 818, and 820) may be formed in the potted epoxy base. Each passive device may be vertically positioned, having a first terminal coupled to the GROUND plane 804 and a second terminal coupled to an I/O pin of a microelectronic module. For example, the passive device 814 may be coupled to an I/O pin 806 thereby terminating its signals to GROUND. Similarly, the passive device 816 may be coupled to an I/O pin 808, the passive device 818 to an I/O pin 810, and the passive device 820 to an I/O pin 812.

Figure 9:
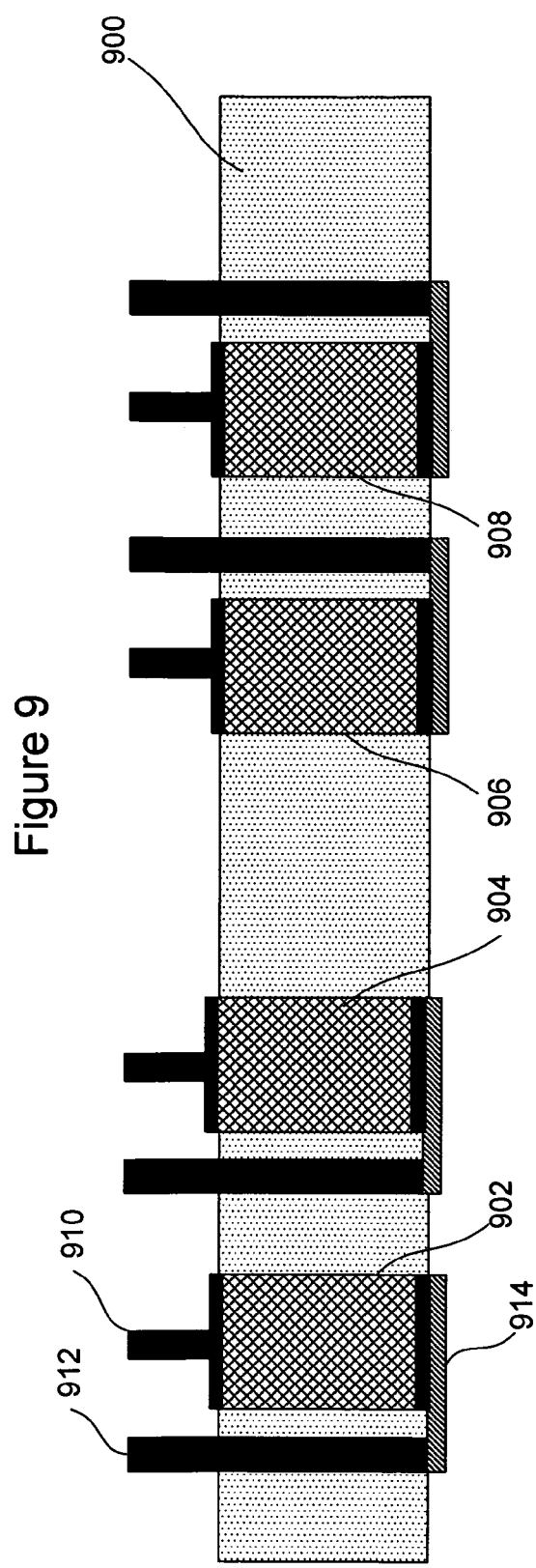
FIG. 9 is a cross-sectional view of a portion of an exemplary discrete package configured for signal pass-through in accordance with an embodiment of the present disclosure.

FIG. 9 is a cross-sectional view of a portion of an exemplary discrete package 900 configured for signal pass-through in accordance with an embodiment of the present disclosure. The exemplary discrete package 900 may have a base made of potted epoxy, for example. An array or matrix of passive devices (e.g., 902, 904, 906, and 908) may be formed in the potted epoxy base. Each passive device may be vertically positioned and may have its terminals so connected to facilitate signal pass-through for a microelectronic module. For example, a first terminal of the passive device 902 may be coupled to a first I/O pin 910 of the microelectronic module. A second terminal of the passive device 902 may be coupled to a second I/O pin 912 via a signal trace 914. As a result, signals may flow between the I/O pins 910 and 912 through the passive device 902.

Figure 10:
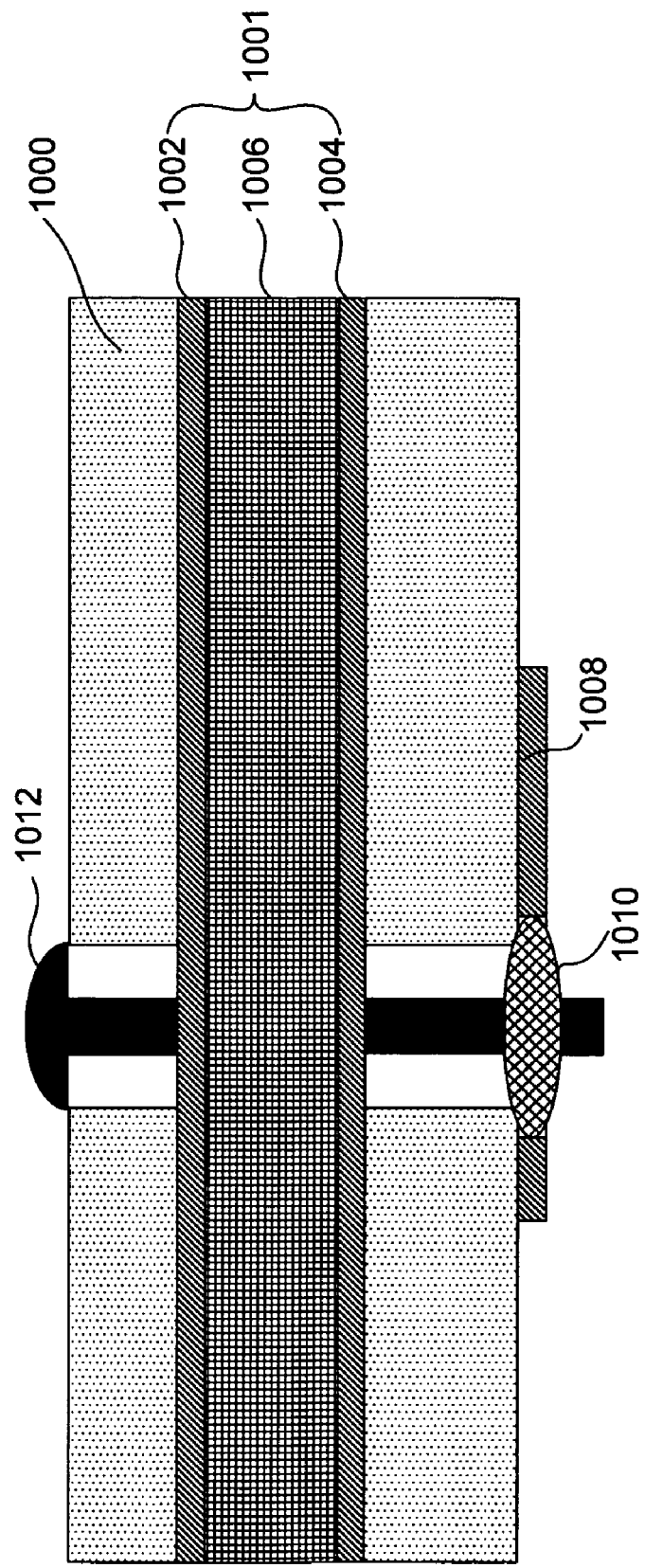
FIG. 10 is a cross-sectional view of a portion of a discrete package with an embedded capacitor in accordance with an embodiment of the present disclosure.

FIG. 10 is a cross-sectional view of a portion of an exemplary discrete package 1000 with an embedded capacitor 1001 in accordance with an embodiment of the present disclosure. The exemplary discrete package 1000 may comprise an embedded dielectric layer 1006 sandwiched between a first conductive layer 1002 and a second conductive layer 1004, thereby forming the embedded capacitor 1001. The conductive layer 1004 may be coupled to a solder point 1010 which may be further coupled to a GROUND plane 1008. The conductive layer 1002 may be coupled to an interconnect 1012 which may be further coupled to a microelectronic module or a circuit board. One or more capacitors similar to the capacitor 1001 may be embedded in the discrete package 1000. This type of embedded capacitors may have substantially large capacitance and may be easily customized to fit design needs.

Figure 11:
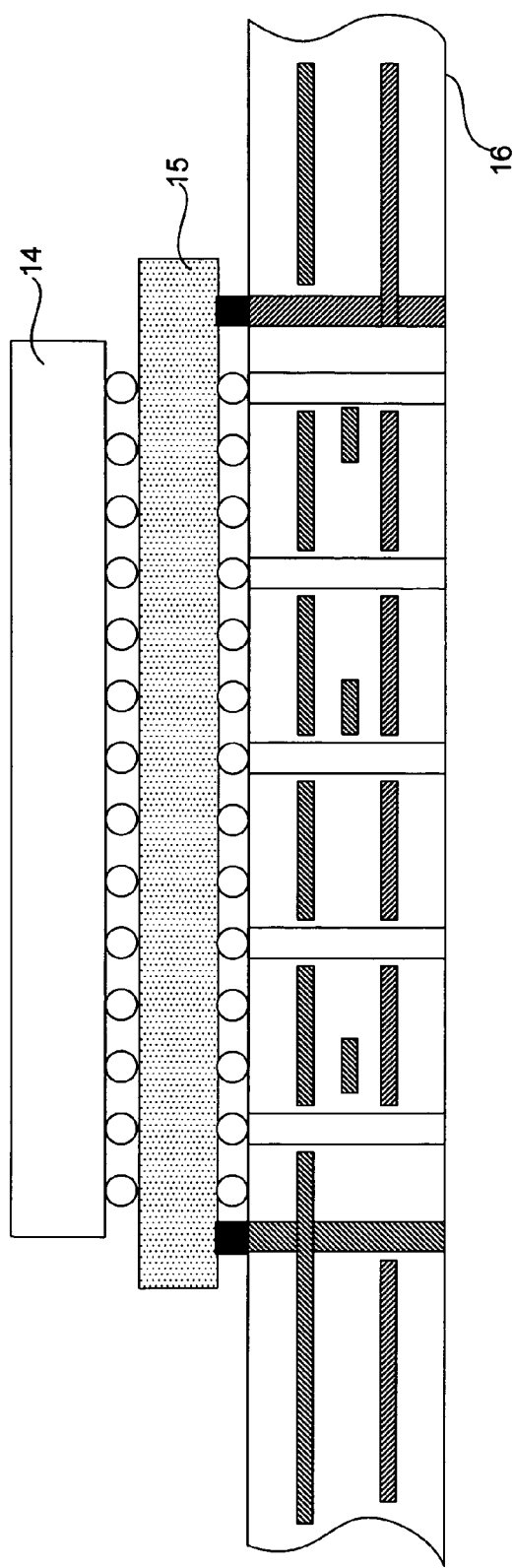
FIG. 11 shows another exemplary assembly of a microelectronic module, a discrete package, and a circuit board in accordance with an embodiment of the present disclosure.

FIG. 11 shows another exemplary assembly of a microelectronic module 14, a discrete package 15, and a circuit board 16 in accordance with an embodiment of the present disclosure. In this exemplary assembly, the discrete package 15 may be mounted on a back side of the microelectronic module 14. And the microelectronic module 14 and the discrete package 15 may be mounted together on the circuit board 16. Compared with the exemplary assembly shown in FIG. 1, the arrangement shown in FIG. 11 may cause the passive devices in the discrete package 15 to be placed even closer to the microelectronic module 14.

According to embodiments of the present disclosure, a plurality of passive devices may be provided in a pre-fabricated package. The passive devices in the pre-fabricated package may be arranged in an array or matrix, and they may be identical devices or non-identical ones with varying properties. The pre-fabricated package may be customized for a particular microelectronic module that requires passive devices. First, the pre-fabricated package may be cut and shaped into a discrete package with a size comparable to that of the microelectronic module. Second, the array of passive devices in the discrete package may be "programmed." That is, interconnects or solder points may be formed to make accessible those passive devices that are desirable for the microelectronic module. On the other hand, the devices that are not desirable may have their terminals blocked or sealed. Then, the "programmed" discrete package may be coupled to the microelectronic module in accordance with the exemplary arrangements described above.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A method for enhancing circuit density and performance of an active microelectronic module having a plurality of input/output pins, the method comprising:
  mounting a discrete package with a dielectric base on a first side of a circuit board, wherein the discrete package comprises a plurality of passive devices configured to be electrically coupled to at least some of the plurality of input/output pins of the active microelectronic module to enhance the electrical performance of the active microelectronic module, wherein at least one of the plurality of passive devices is formed in a via hole extending through the discrete package, wherein the at least one passive device is formed by filling the via hole with one or more materials; and
  mounting the active microelectronic module on a second side of the circuit board for coupling the discrete package to the microelectronic module such that the at least one passive device is electrically coupled to at least one of the plurality of input/output pins of the active microelectronic module.

2. The method according to claim 1, wherein the plurality of passive devices are selected from a group consisting of:
  resistors;
  capacitors; and
  inductors.

3. The method according to claim 1, wherein at least one of the plurality of passive devices is placed in a via hole in extending through the discrete package.

4. The method according to claim 1, wherein:
  at least one of the plurality of passive devices is mounted on a surface of the discrete package.

5. The method according to claim 1, wherein
  at least one of the plurality of passive devices is embedded inside the discrete package.

6. The method according to claim 1, wherein:
  an array of passive devices is formed in the discrete package; and
  the array is configured to provide the plurality of passive devices to enhance the electrical performance of the active microelectronic module.

7. The method according to claim 1, wherein the plurality of passive devices provide an electrical decoupling function for the active microelectronic module.

8. A discrete package system for enhancing circuit density and performance of an active microelectronic module having a plurality of input/output pins, the discrete package system comprising:
  a circuit board;
  an active microelectronic module having a plurality of input/output pins mounted to a first side of the circuit board; and
  a discrete package having a plurality of passive devices mounted to a second side of the circuit board, wherein:
    the plurality of passive devices are configured to be electrically coupled to at least some of the plurality of input/output pins of the active microelectronic module when the active microelectronic module and the discrete package are mounted to the circuit board to enhance the electrical performance of the active microelectronic module, wherein at least one of the plurality of passive devices is formed in a via hole extending through the discrete package, wherein the at least one passive device is formed by filling the via hole with one or more materials; and
    the discrete package is formed with a dielectric base and configured to be coupled to the active microelectronic module when the active microelectronic module and the discrete package are mounted to the circuit board such that the at least one passive device is electrically coupled to at least one of the plurality of input/output pins of the active microelectronic module.

9. The discrete package system according to claim 8, wherein the plurality of passive devices are selected from a group consisting of:
  resistors;
  capacitors; and
  inductors.

10. The discrete package system according to claim 8, wherein at least one of the plurality of passive devices is placed in a via hole extending through the discrete package.

11. The discrete package system according to claim 8, wherein at least one of the plurality of passive devices is mounted on a surface of the discrete package.

12. The discrete package system according to claim 8, wherein at least one of the plurality of passive devices is embedded inside the discrete package.

13. The discrete package system according to claim 8, wherein the discrete package further comprises:
   an array of passive devices that is configured to provide the plurality of passive devices to enhance the electrical performance of the active microelectronic module.

14. The discrete package system according to claim 8, wherein the plurality of passive devices provide an electrical decoupling function for the active microelectronic module.

15. A method for enhancing circuit density and performance of an active microelectronic module having a plurality of input/output pins, the method comprising:

mounting a first side of a discrete package with a dielectric base on a circuit board, wherein the discrete package comprises a plurality of passive devices configured to be electrically coupled to at least some of the plurality of input/output pins of the active microelectronic module to enhance the electrical performance of the active microelectronic module, wherein at least one of the plurality of passive devices is formed in a via hole extending through the discrete package, wherein the at least one passive device is formed by filling the via hole with one or more materials; and mounting the active microelectronic module on a second side of the discrete package for coupling the discrete package to the microelectronic module such that the at least one passive device is electrically coupled to at least one of the plurality of input/output pins of the active microelectronic module.

* * * * *